US006893885B2

(12) United States Patent
Lemmerhirt et al.

(10) Patent No.: US 6,893,885 B2
(45) Date of Patent: May 17, 2005

(54) METHOD FOR ELECTRICALLY AND MECHANICALLY CONNECTING MICROSTRUCTURES USING SOLDER

(75) Inventors: David F. Lemmerhirt, Ann Arbor, MI (US); Kensall D. Wise, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 58 days.

(21) Appl. No.: 10/342,906

(22) Filed: Jan. 15, 2003

(65) Prior Publication Data

US 2003/0178403 A1 Sep. 25, 2003

Related U.S. Application Data

(60) Provisional application No. 60/349,434, filed on Jan. 18, 2002.

(51) Int. Cl.[7] ............................................... H01L 21/66
(52) U.S. Cl. ......................................... 438/17; 219/209
(58) Field of Search ................................ 438/612, 613, 438/615, 109, 15, 17; 257/779; 219/209

(56) References Cited

U.S. PATENT DOCUMENTS

| 4,099,118 | A | 7/1978 | Franklin et al. | |
|---|---|---|---|---|
| 5,786,979 | A | 7/1998 | Douglass | |
| 6,054,720 | A | 4/2000 | Fieselman et al. | |
| 6,355,501 | B1 | 3/2002 | Fung et al. | |
| 6,423,938 | B1 | * | 7/2002 | Murari et al. ............... 219/209 |

OTHER PUBLICATIONS

Lemmerhirt, David F., et al., Field–Operable Microconnections Using Automatically–Triggered Localized Solder-–Bonding, Technical Digest, MEMS 2002 IEEE International Conference on Micro Electro Mechanical Systems, Piscataway New Jersey, pp. 403–406, 2002.

Enikov, Eniko, et al., Electroplated Electro–Fluidic Interconnects For Chemical Sensors, 2000 Elsevier Science S.A. Sensors and Actuators 84, Aug. 1, 2000, pp. 161–164.

Baltes Henry, et al., CMOS–based Microsensors and Packaging, 2001 Elsevier Science, Sensors and Actuators. A 92 pp. 1–9, Aug. 2001.

Lozano, M., et al., Test Structures For MCM–D Technology Characterization, Microelectronic Test Structures, 1998, Proceedings of the 1998 International Conference on Microelectronic Test Structures, vol. 11, Kanazawa, Japan, Mar. 23–26, 1998, New York, New York, IEEE, pp. 183–188.

Cheng, Y.T., et al., Localized Bonding With PSG or Indium Solder as Intermediate Layer, MEMS 1999, pp. 285–289.

Intel Corporation, Intel Flash Memory Chip Scale Package User's Guide, 1999, pp. 1–66.

Harsh, K.F., et al., Study of Micro–Scale Limits of Solder Self–Assembly for MEMS, Electronics Components and Technology Conference, 2000 Proceedings, pp. 1690–1695.

Tartagni, Marco, et al., A 390 DPI Live Fingerprint Imager Based on Feedback Capacitive Sensing Scheme, ISSCC 1997, pp. 200–201, 456.

* cited by examiner

*Primary Examiner*—Stephen W. Smoot
(74) *Attorney, Agent, or Firm*—Brooks Kushman, P.C.

(57) ABSTRACT

A method and system for locally connecting microstructures and devices formed thereby are provided wherein localized solder-bonding creates bonds between pairs of microstructures found on miniature flexible cables and silicon microsystem platforms. Multi-lead contact to the pads are detected automatically, triggering an embedded heater or heaters to initiate solder melting. This approach enables delicate microstructures to be connected and disconnected from microsystem platforms in the field, and is implemented with a process that is compatible with monolithic integration of circuits.

8 Claims, 4 Drawing Sheets

METHOD FOR ELECTRICALLY AND MECHANICALLY CONNECTING MICROSTRUCTURES USING SOLDER

CROSS-REFERENCE TO RELATED APPLICATION

This application claims the benefit of U.S. provisional application Ser. No. 60/349,434, filed Jan. 18, 2002.

STATEMENT REGARDING FEDERALLY SPONSORED RESEARCH OR DEVELOPMENT

The invention was made with Government support under Contract No. EEC-9986866 awarded by The National Science Foundation and No. 0014-98-I-0747 awarded by DARPA. The Government has certain rights to the invention.

BACKGROUND OF THE INVENTION

1. Field of the Invention

This invention relates to methods and systems for locally connecting microstructures and devices formed thereby.

2. Background Art

Microelectromechanical sensors and actuators, as well as circuits for interfacing, control, and communications, have matured significantly in recent years. In order for this technology to have a pervasive impact, however, the diverse electronic and microelectromechanical devices must be integrated, interconnected, and packaged to build viable Microsystems. These Microsystems will be widely used in environmental and biological monitoring, implantable medical devices, and miniature robotics. Many applications require the Microsystems to be extremely small in order to minimize intrusion on the measurement environment. Certain applications also demand the ability to connect and disconnect delicate microstructures in the field, where complex assembly equipment is unavailable. For instance, a biologist may need to swap damaged off-board sensors in an insect-mounted microsystem without removing the system and returning to the laboratory.

FIG. 1 shows a hybrid microsystem, generally indicated at 10, developed for monitoring/controlling insects for biomimetic studies leading toward the development of legged robots and "biobots." The microsystem 10 includes bare-die components 12, a custom printed circuit board 14 and commercial connectors 16. The system 10 contains signal-conditioning circuits for amplifying and multiplexing sensor data from off-board neural probes and mechanical sensors. Although this system 10 is sufficient for use with some insects, its size is prohibitively large for many others.

Approaches to shrinking such systems include monolithic circuit integration, reducing interconnect area by using silicon-based multi-chip modules, and implementing advanced packaging ideas such as folding platforms or three-dimensional assemblies. An important need in further reducing the size of such Microsystems is improved technology for connecting sensors to the platform using minimal area. The connectors 16 around the perimeter of the platform shown in FIG. 1 enable sensors to be connected and disconnected manually; however, they consume an inordinate amount of board area. New developments in connector technology are necessary in order to realize smaller systems.

Solder has long been used in electronic assembly to mechanically and electrically secure packaged components to printed wiring boards. Eutectic metal-alloy solders are designed to have low temperature melting points in order to minimize the temperatures to which components are exposed. Components can be easily removed by withdrawing them while heating the bonding areas. Thus, the use of solder-based interconnects has a number of attractive features. However, traditional soldering methods pose several problems. Sensors and other microstructures are increasingly delicate and can be easily damaged or destroyed, both thermally and mechanically. Use of soldering irons or hot-air tools that are common in the macro-world is not always possible in the micro-domain. For example, using insect-mounted "backpack" Microsystems for gait studies requires connections to leg strain gauges and EMG wires in the field; heating the platform to bonding temperatures with a soldering iron or reflow oven is precluded. For this and many other applications, a different approach to solder connections is necessary.

Many of the problems associated with external heating can be avoided by building heaters into the platform to heat the pad areas only. Chen and Lin, as described in their article entitled "Localized bonding with PSG or indium solder as intermediate layer," *MEMS* 1999, pp. 285–289, have exploited this concept for silicon-to-glass bonding using localized heating of indium solder.

If solder bonding is to be useful for microconnections, the technology must be scalable to sub-millimeter dimensions. Solder has rarely been used for lead-pitches less than 1 mm, and many applications have much less stringent size requirements.

Recently, solder balls for flip-chip bonding and chip-scale packages have been used commercially at pitches as small as 0.75 mm (Intel Corporation, *Intel Flash Memory Chip Scale Package User's Guide,* 1999).

Harsh and Lee have used surface-area minimization of solder during melting for MEMS self-assembly, as described in their article, "Study of micro-scale limits of solder self-assembly for MEMS," *Electronics Components & Technology Conference,* 2000 Proceedings, pp. 1690–1695. They report experiments and simulations indicating that the physical behavior of solder should remain consistent with scaling, even to sub-micron dimensions. This work suggests that solder should behave predictably on the scale 25 $\mu$m to 500 $\mu$m—the regime of interest for microconnections to components such as MEMS sensors. Also, solder's tendency to coagulate and draw structures together is potentially beneficial to microconnections.

The variation of fringing capacitance induced by bringing an object into close proximity of multiple metal pads has been exploited in several ways. Franklin et al. used this concept for an electronic wall stud sensor, as described in U.S. Pat. No. 4,099,118.

Tartagni et al., as described in "A 390 dpi Live Fingerprint Imager Based on Feedback Capacitive Sensing Scheme," *ISSCC* 1997, pp. 200–201, have used a technology for live fingerprint imaging based on a feedback capacitive sensing scheme. Here, the ridges and valleys of a human fingerprint are detected by an array of divided pads. The capacitance between neighboring pads varies according to whether skin (a ridge) or air (a valley) overlays the plates.

SUMMARY OF THE INVENTION

An object of the present invention is to provide a method and system for locally connecting microstructures and devices formed thereby wherein direct connections from microstructures to platforms are enabled without any specialized bonding equipment. Also, non-destructive disconnect is permitted. Such microconnections can be built using a circuit-compatible fabrication process.

In carrying out the above object and other objects of the present invention, a method for locally connecting a pair of microstructures is provided. The method includes the steps of aligning the microstructures in close proximity to one another, controllably melting solder over surfaces of the aligned microstructures and allowing the melted solder to solidify to mechanically and electrically connect the microstructures together.

The method may further include determining when the microstructures are aligned in close proximity to one another and providing a corresponding signal. The step of controllably melting is performed in response to the signal.

One of the microstructures may include a pair of regions having an electrical property wherein the step of determining may include the step of measuring the electrical property between the pair of regions.

One of the microstructures and a heater may be formed on a substrate wherein the step of controllably heating may include the step of causing the heater to heat the solder.

The heater and the one of the microstructures may be formed in a region thermally isolated from other microstructures formed on the substrate.

Further in carrying out the above object and other objects of the present invention, a method for locally connecting a plurality of microstructures is provided. The method includes the step of aligning the microstructures to form aligned pairs of microstructures. The microstructures of each aligned pair of microstructures are in close proximity to one another. The method also includes the steps of controllably melting solder over surfaces of desired aligned pairs of microstructures and allowing the melted solder to solidify to mechanically and electrically connect desired pairs of the microstructures together.

The method may further include determining when the microstructures of each pair are aligned in close proximity to one another and providing a corresponding signal. The step of controllably melting may be performed in response to the signal.

One microstructure of each pair may include a pair of regions having an electrical property wherein the step of determining may include the step of measuring the electrical property between each pair of regions.

One microstructure of each pair and at least one heater may be formed on a substrate wherein the step of controllably heating may include the step of causing the at least one heater to heat the solder.

The at least one heater and one microstructure of each pair may be formed in a region thermally isolated from other microstructures formed on the substrate.

Still further in carrying out the above object and other objects of the present invention, a system for locally connecting a pair of aligned microstructures is provided. The system includes a power supply, a heater for converting power from the power supply to heat energy and a controller for determining when the microstructures are aligned in close proximity to one another and providing a corresponding control signal. The power supply supplies power to the heater in response to the control signal to melt solder over surfaces of the aligned microstructures. The melted solder mechanically and electrically connects the microstructures together when solidified.

The system may further include a temperature sensor for sensing temperature and providing a corresponding temperature signal for use in controlling power from the power supply.

One of the microstructures may include a pair of regions having an electrical property wherein the controller measures the electrical property between the pair of regions.

One of the microstructures, the heater and the controller may be formed on a substrate.

The heater and the one of the microstructures may be formed in a region thermally isolated from other microstructures formed on the substrate.

Yet still further in carrying out the above object and other objects of the present invention, a system for locally connecting a plurality of microstructures is provided. The system includes a power supply, at least one heater for converting power from the power supply to heat energy and a controller for determining when the microstructures are aligned to form aligned pairs of microstructures in close proximity to one another and providing a corresponding control signal. The power supply supplies power to the at least one heater in response to the control signal to melt solder over surfaces of desired aligned pairs of microstructures. The melted solder mechanically and electrically connects each desired pair of the microstructures together when solidified.

The system may further include a temperature sensor for sensing temperature and providing a corresponding temperature signal for use in controlling power from the power supply.

One microstructure of each pair may include a pair of regions having an electrical property wherein the controller may measure the electrical property between each pair of regions.

One microstructure of each pair, the at least one heater and the controller may be formed on a substrate.

The at least one heater and one microstructure of each pair may be formed in a region thermally isolated from other microstructures formed on the substrate.

Further in carrying out the above object and other objects of the present invention, a device including a substrate and a pair of microstructures soldered together so that the pair of microstructures are mechanically and electrically connected together is provided. A resistive heating element is formed on the substrate, together with one of the microstructures and is adapted to receive a signal which, in turn, causes the heating element to melt solder located between surfaces of the microstructures to allow the pair of microstructures to be disconnected.

Still further in carrying out the above object and other objects of the present invention, a device including a substrate and a plurality of microstructures soldered together so that pairs of microstructures are mechanically and electrically connected together is provided. At least one resistive heating element is formed on the substrate, together with one of the microstructures of each pair of microstructures, and is adapted to receive a signal which, in turn, causes the heating element to melt solder located between surfaces of the microstructures to allow each pair of microstructures to be disconnected.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENT(S)

Figure 1:
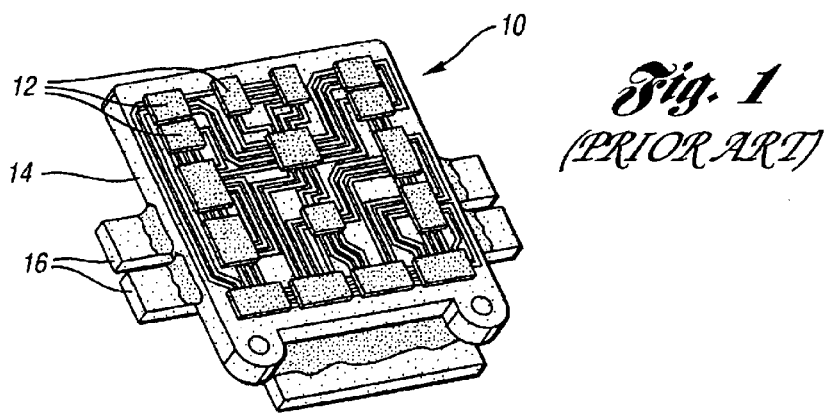
FIG. 1 is a top perspective schematic view of a hybrid insect-monitoring microsystem populated with commercial connects for off-board sensors.
Figure 2:
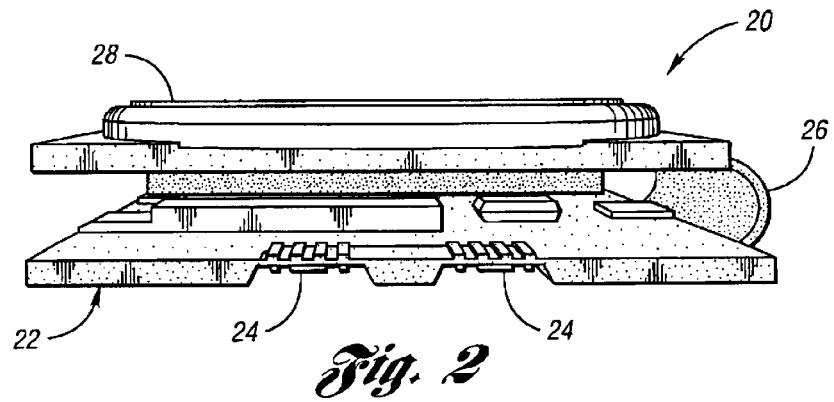
FIG. 2 is a side perspective schematic view of a microsystem using solder-based microconnections, a folding silicon platform, and both hybrid and monolithic circuit integration.

In general, solder-based microconnections in which contact is automatically detected in the bonding pad area to initiate bonding by triggering localized heating of solder is described herein. This approach requires very little force and no equipment beyond a positioning tool or manipulator. FIG. 2 illustrates a system, generally indicated at 20, that implements such microconnections along with some of the aforementioned approaches to shrinking the size of Microsystems. The system 20 includes a CMOS multi-chip module 22, solder-based microconnections 24, a folding hinge assembly 26 and a battery or power source 28.

For the microconnections, heat is applied directly under metal contact pads on a silicon substrate. When a device with pre-soldered lead tabs contacts the heated pads, the solder melts and establishes the desired bonds between the lead tabs and the pads. By confining the heated region to a very small area using thermal isolation, relatively low power is consumed, and the operation of neighboring devices on the wafer is not affected.

The microconnection approach of the present invention is designed to exploit the properties of solder bonding to produce automated, high-density connections to delicate microstructures in the field and elsewhere. Proper alignment and placement of multi-lead ribbon cables is automatically detected at a series of contact pads to trigger localized solder melting between the pads and metal lead tabs on the cable to form electrically and mechanically stable connections.

Figure 3:
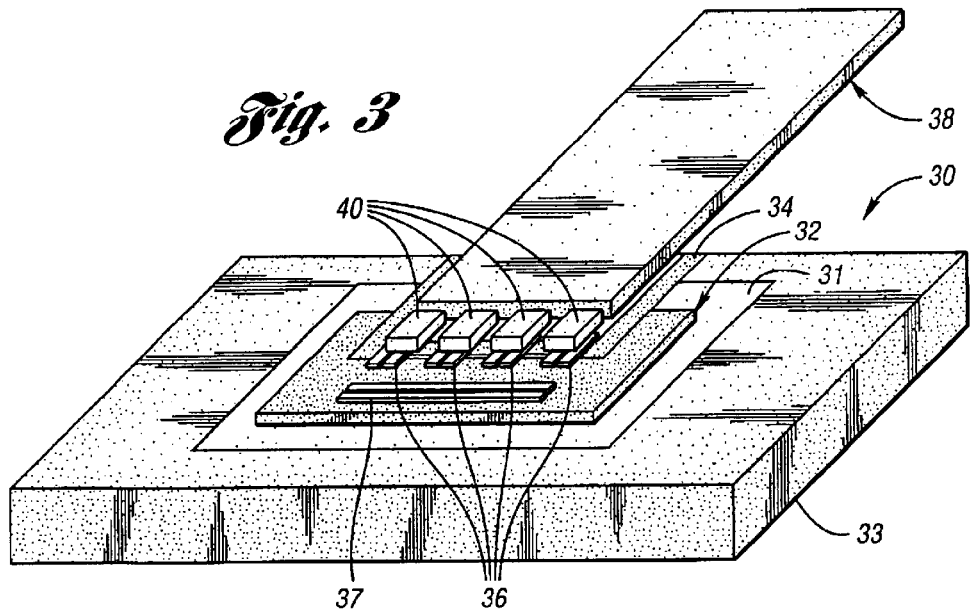
FIG. 3 is a top perspective schematic view of the micromachined microconnection approach of the present invention wherein multi-lead contacts between a series of pads and a polyimide-based ribbon cable are provided.

As shown in FIG. 3, the structure or device, generally indicated at 30, includes a silicon island 32 thermally isolated via a dielectric window 31 on a silicon wafer or substrate 33 and supporting a polysilicon heater 34 and multiple interdigitated metal contact pads 36.

To minimize the power expended melting the solder and to confine the heat locally to prevent damaging neighboring circuits or microstructures, the island or region 32 is thermally isolated. The thermally isolated region 32 can be formed in the silicon wafer 33 using various approaches, most involving removal of thermally conductive material surrounding the region 32. Over the thermally isolated region 32, the miniature heating element 34 is formed. A resistive strip of a material such as polysilicon or a large MOS transistor can be used for the heating element 34. A second polysilicon resistor or MOS transistor can serve as a temperature sensor 37 to enable closed-loop temperature control during solder melting. The heating element 34 and the temperature sensor 37 are sandwiched between two dielectric layers (indicated at 39 and 41 in FIG. 6) to electrically isolate them from the environment and from other system components.

The metal pads 36 are defined photolithographically on the top surface of the device 30. Each pad 36 is divided into two interdigitated regions 42. These regions 42 are connected by metal or polysilicon lines (indicated at 43 in FIG. 5) to a controller, generally indicated at 44, which includes detection circuits (indicated at 45 in FIGS. 5 and 6) outside of the thermally isolated area 32.

The pads 36 are designed to interface with a flexible polyimide ribbon cable, generally indicated at 35, having metal lead tabs 40 pre-coated with solder or plated with a suitable eutectic alloy solder.

Figure 4:
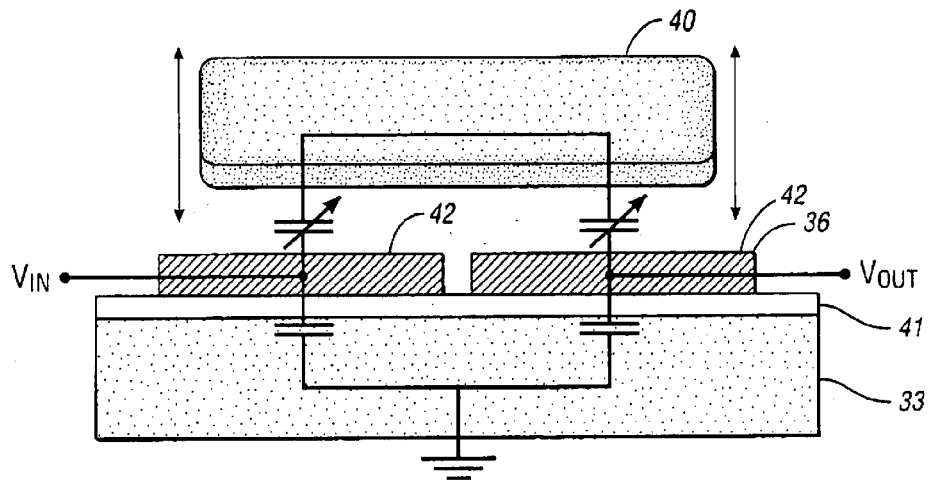
FIG. 4 is a side schematic view illustrating a capacitive model for detecting between positions.
Figure 5:
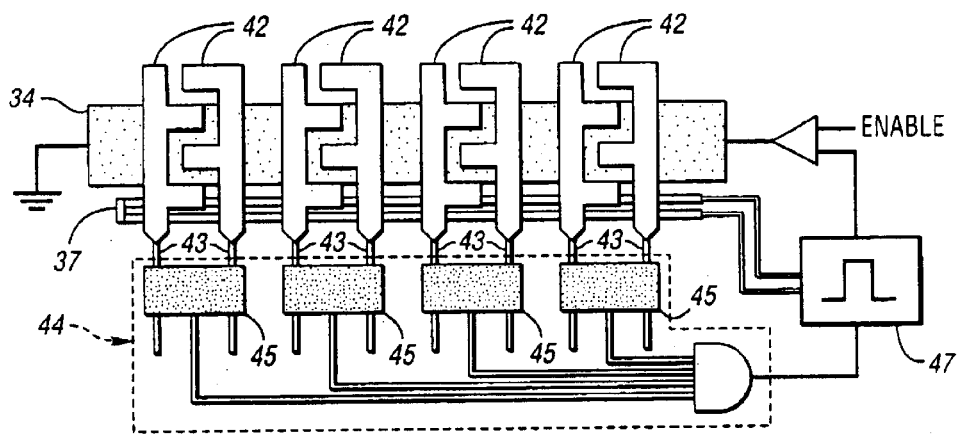
FIG. 5 is a schematic view of a contact detection and heater-triggering scheme of the present invention with closed-loop temperature control.

As shown in FIG. 4, when a lead tab 40 closely approaches a pad 36, its presence is detected by the impedance change between the interdigitated pad regions 42 of the pad 36. Since native oxides on the metal tab 40 and the metal pad 36 may prevent a direct path for current flow even when the elements touch, the high-frequency (capacitance dominated) impedance most clearly indicates contact. When the cable 38 is properly aligned, contact is detected in all bonding areas, the controller 44 causes a current pulse (as indicated at 47 in FIG. 5) to be directed to the polysilicon heater 34, causing the solder to melt and solidify, forming stable electrical and mechanical bonds between the cable leads 40 and the pads 36, as shown in FIG. 5.

To ensure high-quality solder joints, closed-loop temperature control can be implemented using the integrated temperature sensor 37 to monitor the local temperature and appropriately adjust the power applied to the heater 34. This feedback mechanism is especially important because the thermal capacity of the microstructures being heated will vary depending on the application. FIG. 5 is a schematic block diagram of this detection, heating, and feedback scheme.

During a subsequent current pulse, the solder re-melts, and the cable 38 can be withdrawn for replacement.

Contact detection and triggering of the heater 34 can be automated to enable connections by simply touching the cable leads or tabs 40 to the pads 36 and waiting momentarily for the bonds to be formed.

Device Fabrication

Figure 6:
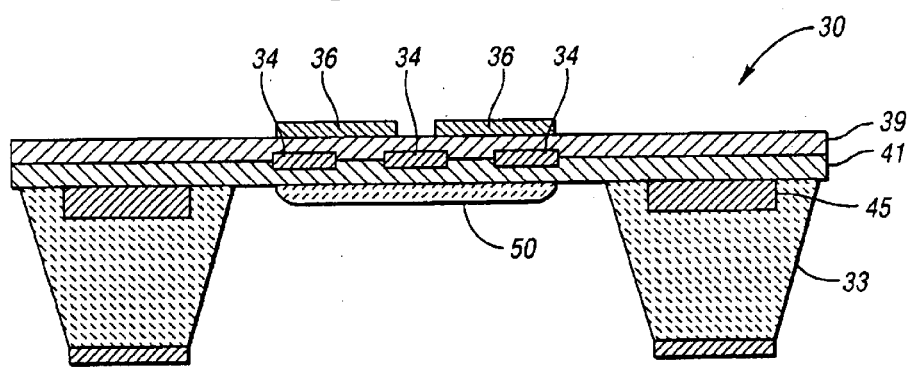
FIG. 6 is a side cross-sectional view of a bonding area.
Figure 7:
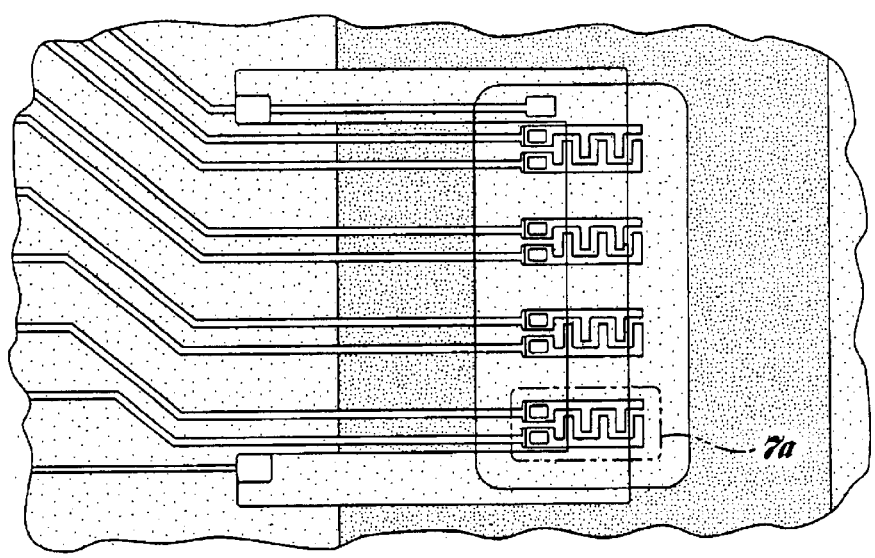
FIG. 7 is a top view, partially broken away, of a bonding area.
Figure 7A:
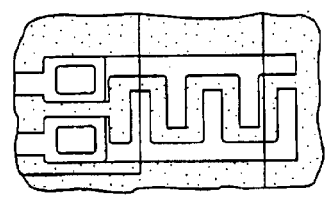
FIG. 7a is an enlarged view, partially broken away, of a single contact pad of the bonding area of FIG. 7.

Microconnection structures with contact pitches of 400 $\mu$m, 200 $\mu$m, and 100 $\mu$m have been fabricated using a five-mask circuit-compatible bulk-micromachining process as described by D. J. Anderson, K. Najafi, S. J. Tanghe, D. A. Evans, K. L. Levy, J. P. Hetke, X. Xue, J. J. Zappia and K. D. Wise in their article entitled "Batch fabricated thin-film electrodes for stimulation of the central auditory system," *IEEE Transactions on Biomedical Engineering*, Vol. 36, Issue 7, July 1989, pp. 693–704. The process begins by diffusing boron 15 $\mu$m deep into a p-type silicon substrate to form rectangular $p^{++}$ regions. Next, layers of $SiO_2$, $Si_3N_4$, and $SiO_2$ are sequentially deposited using chemical vapor deposition (CVD). A layer of CVD polysilicon is deposited over the dielectrics and is dry etched to define heater strips and interconnects. After deposition of an upper stack of stress-compensating delectrics, Cr—Au is sputtered and patterned to form contact pads and metal lines. Finally, windows are etched through dielectrics on the backside of the wafer, and the wafer is wet-etched in tetramethyl ammonium hydroxide (TMAH) or ethylene diamine pyrocatecol (EDP). These etchants effectively stop on $SiO_2$, $p^{++}$ silicon, and <111> crystal planes in silicon. Therefore, the etching forms pyramidal pits and leaves thermally-isolated $pp^{++}$ silicon "islands" suspended from the dielectric membrane on the front side of the wafer 33. FIG. 6 shows a cross-section of the bonding area, FIG. 7 shows a top view of a bonding area and FIG. 7*a* a close-up view of a single interdigitated pad from the bonding area.

To interface with the pads, miniature flexible ribbon cables with pre-soldered lead tabs have been fabricated with pitches corresponding to the contact pad spacings. A four-mask process is used to build polyimide cables with electroplated copper lines as described by J. F. Hetke, K. Najafi and K. D. Wise in their article entitled "Flexible Miniature Ribbon Cables for Long-Term Connection to Implantable Sensors," *Sensors and Actuators*, A21–A23, 1990, pp. 999–1002. A silicon carrier wafer covered with thick sacrificial oxide is spin-coated with photo-definable polyimide and the cable shapes are patterned into this layer. A Ti—Cu seed layer is sputtered over the entire wafer, and thick photoresist is patterned for an electroplating mold as described by J. B. Yoon, C. H. Han, E. Yoon and C. K. Kim in their article entitled "Novel two-step baking process for high-aspect-ratio photolithography with conventional positive thick photoresist," *MEMS* 1999, pp. 316–318. After electroplating 15 µm of copper, the photoresist and seed layer are removed, leaving plated copper lines on the polyimide cables with lead tabs extending beyond the ends of the cables. A second layer of polyimide, which is also patterned with the cable shapes, encapsulates the metal lines. Indium or lead-tin solder is electroplated on the lead-tabs using another thick photoresist mold. Alternatively, solder can be manually applied to the lead-tabs of released cables by dipping them in molten lead-tin or indium solder. The cables are released from the wafer by etching the sacrificial oxide in buffered HF.

Tests have been performed to evaluate the feasibility of the microconnection approach and to determine the electrical and thermal behavior of the devices before, during and after bonding. To facilitate thermal testing, the microconnection structure includes serpentine polysilicon resistors on the suspended $p^{++}$ island (i.e., indicated at 50 in FIG. 6). These resistors can be configured in a full or half bridge configuration for monitoring the temperature of the pad area. Also, the interdigitated regions of each metal contact pad are separately accessible via wire-bond pads, which can be probed or bonded to the leads of a test package.

The ability to detect contact between cable leads and contact pads on the substrate is important. To test the detection scheme, a lead tab on a cable is lowered onto a contact pad, and the 10 MHz impedance between the interdigitated pad regions is monitored. As the cable lead tab approaches and then touches the contact pad, the magnitude of the impedance decreases significantly due to the increased series capacitance through the tab. When the cable is far away from the pads, the impedance between the two pad regions at 10 MHz is 23 kΩ; as the lead tab contacts the pad, the impedance decreases to 1.9 kΩ. These results closely match calculations for the capacitance change caused by moving the tab from an infinite distance to close contact (with the final capacitive gap defined only by a thin native oxide on the lead tab). This impedance change can be used as an electrical signature for the tab touch-down sequence, enabling automatic triggering of the heater.

Figure 8A:
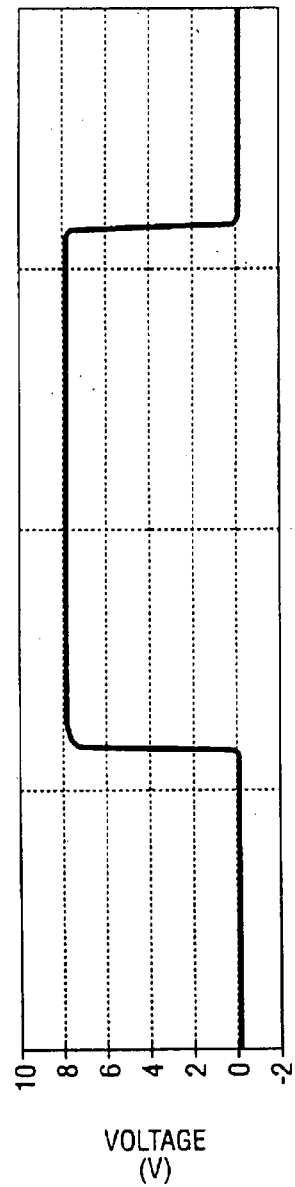
FIGS. 8a–8c are graphs which show curves of input voltage, temperature, and pad resistance vs. time during the bonding process.
Figure 8B:
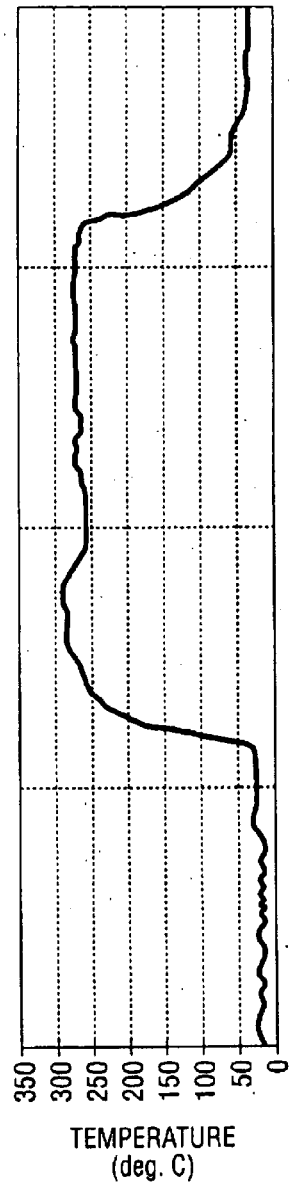
Figure 8C:
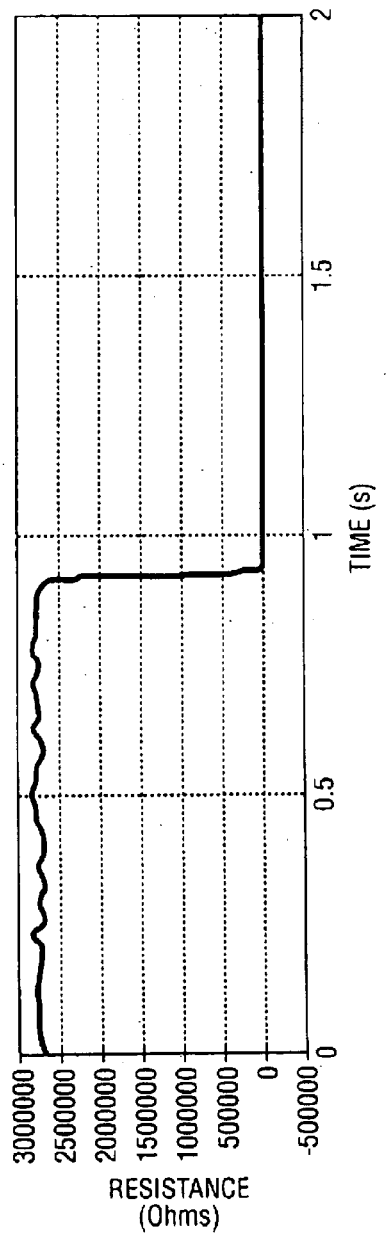

After the lead tabs are in contact with the pads, the connection mechanism itself can be evaluated by pulse heating the structure while the island temperature and the electrical impedance between the contact regions of the metal pads are monitored and displayed on a digital storage oscilloscope. The results are plotted in FIGS. 8*a*–8*c*. For initial testing, a single pulse of 8V is applied to the heater for 1 second. The island temperature quickly increased from room temperature to 285° C., causing the solder on the lad tabs to melt. The molten solder provides a low-impedance path (<10Ω) between the interdigitated pad regions and between the pad and the lead tab. This process occurred in approximately 350 ms. When the current pulse ended, the island cooled and caused the solder to harden. Measurements of the steady-state power required to heat the pad with and without the cable present show heating efficiencies of 1.3 mW/° C. and 2.0 mW/° C., respectively. The solder forms a secure mechanical and electrical bond between the lead tab and the contact pad.

Figure 9:
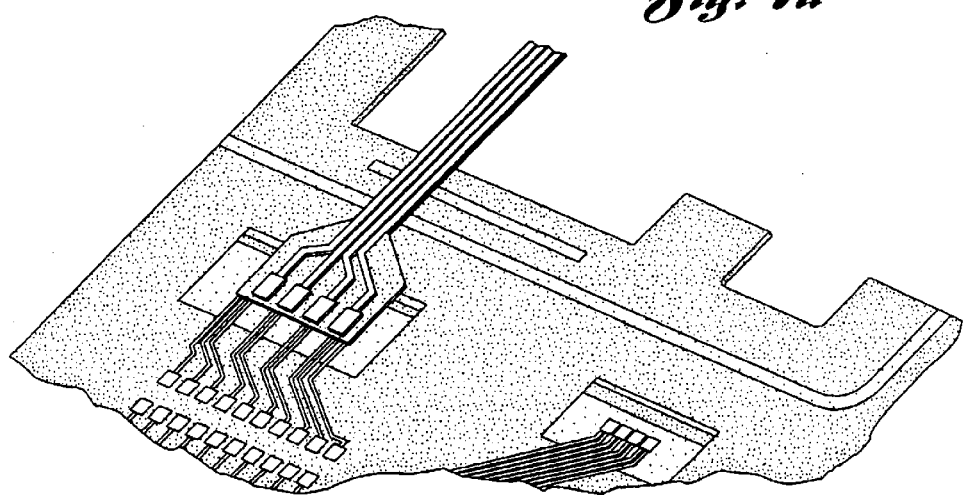
FIG. 9 is a top schematic view, partially broken away, showing two connection areas on a silicon substrate, one with a bonded polyimide cable.

FIG. 9 is a top schematic view of a multi-lead cable bonded to a contact pad. Pads have been bonded on 100 µm, 200 µm, and 400 µm centers. Although the mechanical strength of the stress-compensated dielectric windows has been adequate for the structures explored thus far, using oxidized porous silicon plugs built into the bulk substrate would reduce the structure's fragility while retaining much of its thermal isolation.

The following features of the invention are new in view of the known prior art:

- The concept of circuit pads that automatically detect contact and initiate a connection to an external device.
- The use of localized heating to melt solder and form electrical connections to a multi-lead cable or device.
- The detection of proximity and alignment of sub-millimeter device leads over circuit contact pads using capacitance variation between divided pad regions.
- The combined application of the preceding to produce very small high-density connectors that can be connected and disconnected in the field without complex equipment.
- The fabrication of high-density connector devices monolithically with other devices on silicon substrates.

The device structure and fabrication approach described above achieves the desired result; however, several variations in fabrication and device design could be used to achieve the same goal. A few such approaches are described here.

1) Oxidized porous silicon could be used to form a thermally isolated region of the wafer as described by A. G. Nassiopoulou and G. Kaltsas in their article entitled "Porous Silicon as an Effective Material for Thermal Isolation on Bulk Crystalline Silicon," *Phys. Stat. Sol.* (a) 182, 2000, pp. 307–311. Thick layers of porous silicon can be formed in unmasked regions of a silicon wafer when the wafer is etched in hydrofluoric acid under bias. After the electrochemical etch step, the porous silicon can be converted to silicon dioxide (which has relatively low thermal conductivity) in a high temperature furnace. Using this method, silicon dioxide plugs can be formed prior to the other processing steps. The heater and pads can then be fabricated over these regions to isolate the heat in the desired region. This method may be favorable over these regions to isolate the heat in the desired region. This method may be favorable since the connector pads are supported by a solid substrate rather than being suspended by thin-film dielectrics. Therefore more force can be used to press the leads to the contact pads.

2) The method described in (1) could be combined with a backside etch to form thick silicon dioxide membranes suspended over cavities. This method further reduces the thermal conduction away from the heated region since the contact surface area is reduced. The backside etch could be performed with deep reactive ion etching (DRIE) or wet etching using the oxide as an etch stop.

3) A variety of detection schemes could be used to determine the proximity and proper alignment of leads or tabs over the contact pads. If a magnetic element were fabricated on the tabs, variations in magnetic or electrostatic fields over the pads could be used to trigger the detection or control circuitry. Mechanical sensors could be incorporated into the contact pad regions so that detection could be based upon mechanical deflection of a trigger structure.

4) For applications where low power dissipation and protection of neighboring devices are not critical, thermal isolation could be neglected and more power could be directed to the heater to melt the solder. This may be appropriate for "stand-alone" connector structures that would be attached to a printed circuit board or multi-chip module rather than integrated monolithically with other devices.

5) Rather than using a single heater strip to melt solder simultaneously on multiple pads, each pad could be paired with its own heating element or heater. This would enable single lead connections as well as selective connections to individual leads or solder bumps on a multi-lead structure. Each pad/heater structure could be individually addressed to select which pads would be connected to a given structure. This technique could also be used in manufacturing to populate selected sites on a substrate with desired components while leaving other sites vacant for later use.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for locally connecting a pair of microstructures, the method comprising the steps of:

aligning the microstructures in close proximity to one another;

automatically determining when the microstructures are aligned in close proximity to one another and providing a corresponding signal;

controllably melting solder over surfaces of the aligned microstructures in response to the signal; and allowing the melted solder to solidify to mechanically and electrically connect the microstructures together wherein one of the microstructures has an electrical property and wherein the step of automatically determining includes the step of measuring the electrical property.

2. The method as claimed in claim 1, wherein the one of the microstructures includes a pair of regions having the electrical property and wherein the step of automatically determining includes the step of measuring the electrical property between the pair of regions.

3. The method as claimed in claim 1, wherein one of the microstructures and a heater are formed on a substrate and wherein the step of controllably melting includes the step of causing the heater to heat the solder.

4. The method as claimed in claim 3, wherein the heater and the one of the microstructures are formed in a region thermally isolated from other microstructures formed on the substrate.

5. A method for locally connecting a plurality of microstructures, the method comprising the steps of:

aligning the microstructures to form aligned pairs of microstructures, wherein the microstructures of each aligned pair of microstructures are in close proximity to one another;

automatically determining when the microstructures of each pair are aligned in close proximity to one another and providing a corresponding signal;

controllably melting solder over surfaces of desired aligned pairs of microstructures in response to the signal; and allowing the melted solder to solidify to mechanically and electrically connect desired pairs of the microstructures together wherein one microstructure of each pair has an electrical property and wherein the step of automatically determining includes the step of measuring the electrical property.

6. The method as claimed in claim 5, wherein the one microstructure of each pair includes a pair of regions having the electrical property and wherein the step of automatically determining includes the step of measuring the electrical property between each pair of regions.

7. The method as claimed in claim 5, wherein one microstructure of each pair and at least one heater are formed on a substrate and wherein the step of controllably melting includes the step of causing the at least one heater to heat the solder.

8. The method as claimed in claim 7, wherein the at least one heater and one microstructure of each pair are formed in a region thermally isolated from other microstructures formed on the substrate.

* * * * *